United States Patent [19]

Baba et al.

[11] Patent Number: 5,578,508
[45] Date of Patent: Nov. 26, 1996

[54] VERTICAL POWER MOSFET AND PROCESS OF FABRICATING THE SAME

[75] Inventors: Yoshiro Baba, Yokohama; Satoshi Yanagiya; Noboru Matsuda, both of Kawasaki; Akihiko Osawa; Masanobu Tsuchitani, both of Tokyo, all of Japan

[73] Assignee: Kabushiki Kaisha Toshiba, Kawasaki, Japan

[21] Appl. No.: 426,233

[22] Filed: Apr. 21, 1995

Related U.S. Application Data

[62] Division of Ser. No. 330,828, Oct. 27, 1994, abandoned.

[30] Foreign Application Priority Data

Oct. 28, 1993 [JP] Japan .................................. 5-270650

[51] Int. Cl.$^6$ ...................... H01L 21/265; H01L 21/302; H01L 21/304; H01L 21/76
[52] U.S. Cl. ................... 437/35; 437/40; 437/41; 437/67
[58] Field of Search ............... 437/35, 67, 40 DM, 437/41 DM, 203, 45; 257/330, 331, 332, 333, 334

[56] References Cited

U.S. PATENT DOCUMENTS

| 4,653,177 | 3/1987 | Lebowitz et al. | 437/35 |
| 4,893,160 | 1/1990 | Blanchard | 257/334 |
| 4,994,409 | 2/1991 | Yoon et al. | 437/164 |
| 5,029,324 | 7/1991 | Osawa et al. | . |
| 5,034,785 | 7/1991 | Blanchard | 257/330 |
| 5,047,359 | 9/1991 | Nagatomo | 437/35 |
| 5,126,807 | 6/1992 | Baba et al. | . |
| 5,168,331 | 12/1992 | Yilmaz | 257/331 |
| 5,364,810 | 11/1994 | Kosa et al. | 437/203 |

*Primary Examiner*—Mary Wilczewski
*Assistant Examiner*—Brian K. Dutton
*Attorney, Agent, or Firm*—Finnegan, Henderson, Farabow, Garrett & Dunner, L.L.P.

[57] ABSTRACT

A channel region and a source region are formed on a surface of a substrate by double diffusion. A trench is formed so as to penetrate a part of the channel region and a part of the source region and reach the substrate. After an insulating film is formed on an inner wall of the trench, a polysilicon layer is buried up to an intermediate portion of the trench. In this state, channel ions are implanted in a side surface region of the trench, thereby depleting a channel region. Thereafter, a polysilicon layer for leading out a gate is buried in the trench.

9 Claims, 4 Drawing Sheets

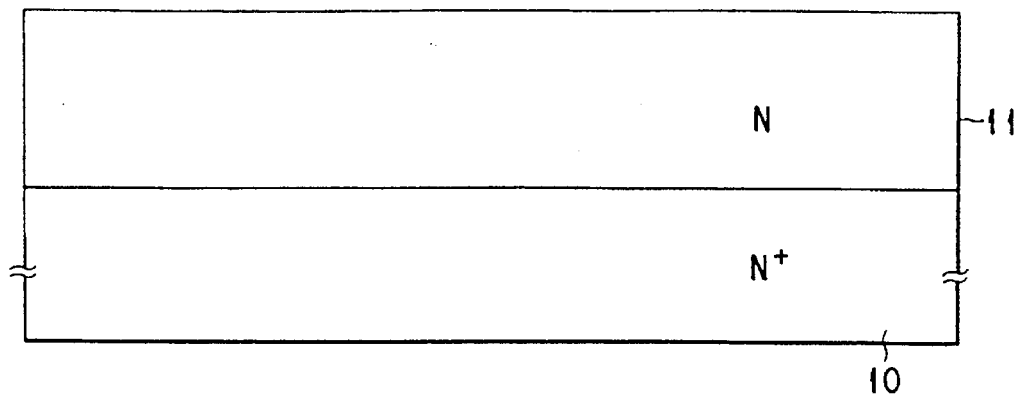
F I G. 3A
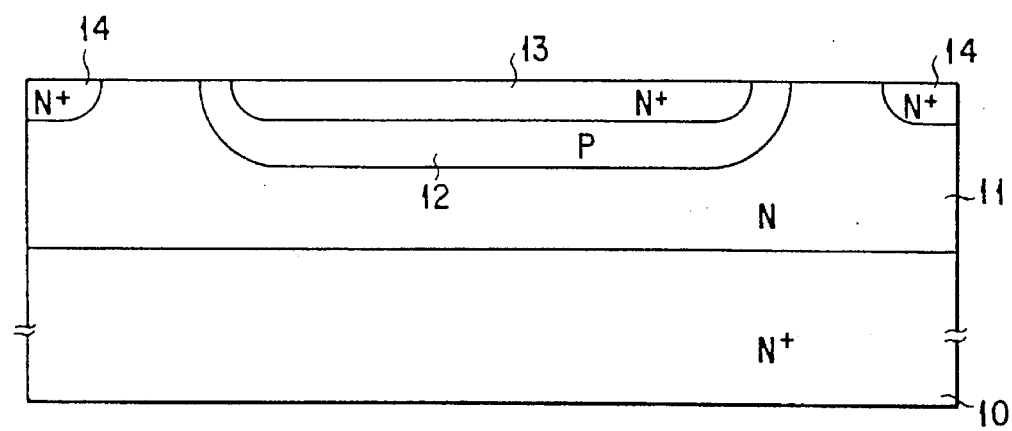
F I G. 3B
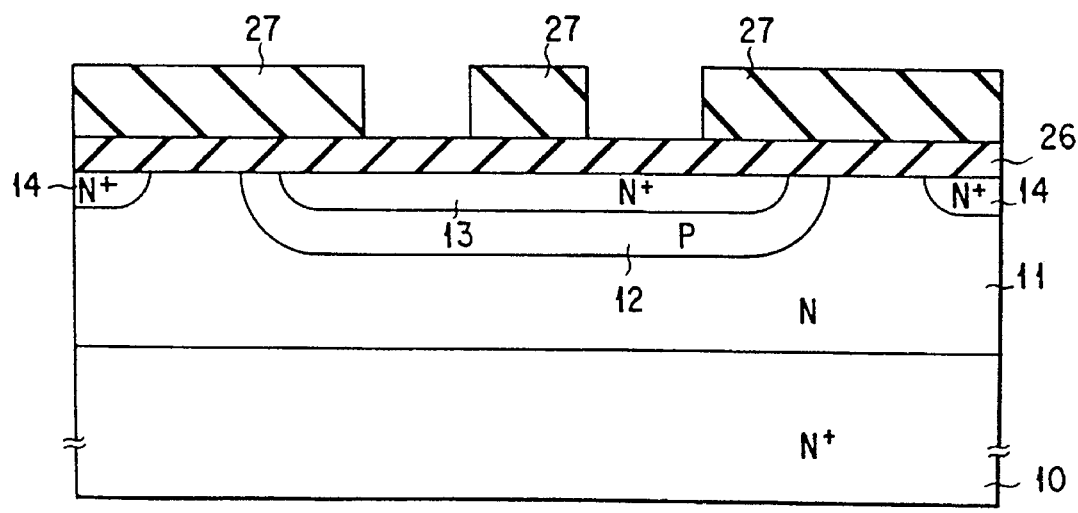
F I G. 3C

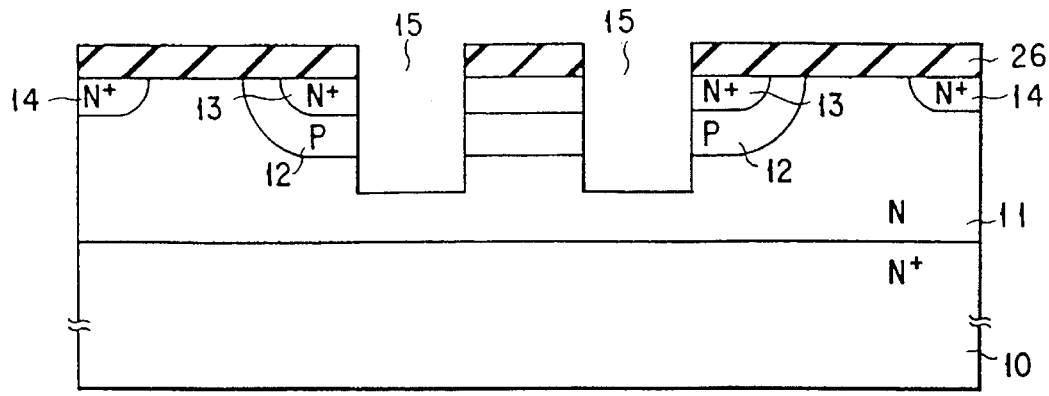
F I G. 3D
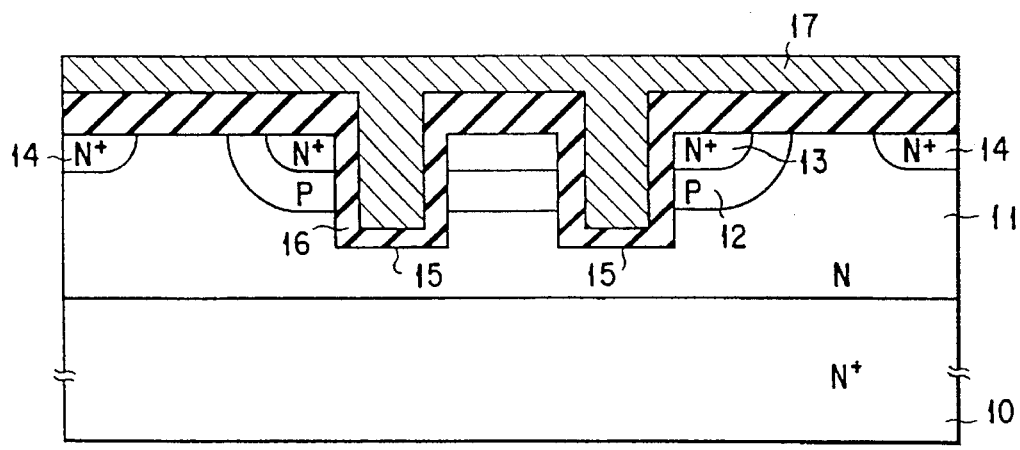
F I G. 3E
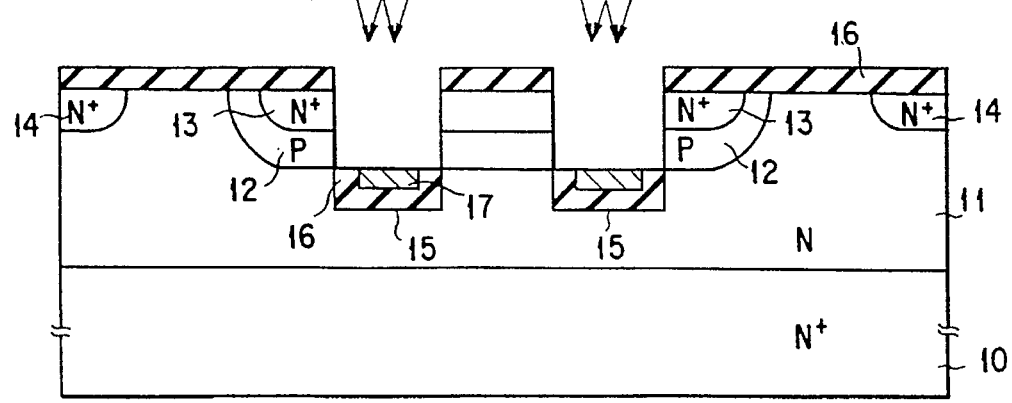
F I G. 3F

1

VERTICAL POWER MOSFET AND PROCESS OF FABRICATING THE SAME

This is a division of application Ser. No. 08/330,828, filed Oct. 27, 1994, now abandoned.

BACKGROUND OF THE INVENTION

1. Field of the Invention

The present invention relates to a discrete semiconductor device having a single unit of a power insulated-gate type field effect transistor ("power MOSFET") or a semiconductor device such as a MOS integrated circuit (IC) in which a power MOSFET is formed, and a process of fabricating these semiconductor devices, and more particularly to a structure of a vertical normally-on-type power MOSFET with a trench structure having a channel region adjoining a side wall of a U-cross sectional trench and a process of fabricating the vertical normally-on-type power MOSFET.

2. Description of the Related Art

With a development of fine processing techniques, the on-state resistance of power MOSFETs has been decreased more and more. At present, trench-structure vertical power MOSFETs having a smaller cell size than a planar-structure diffusion self alignment (DSA) type device have been developed.

In the field of planar-structure power MOSFETs, a method for achieving a depletion mode (normally-on type) has been proposed, wherein a surface of a substrate is subjected to double diffusion to form a base region and a source region, following which a channel, ion implantation is effected. According to this method, double diffusion of a base and a source is performed by solid-phase diffusion from a polysilicon containing impurities, the polysilicon is removed, and a channel ion implantation is performed. Thereafter, a polysilicon gate electrode must be formed once again. Consequently, the number of steps of a photo engraving process (PEP) is large, and an alignment error may occur between a polysilicon gate electrode and a channel region.

On the other hand, in the field of vertical power MOSFETs, a normally-off-type device has been realized but a normally-on-type device has not. In a possible method of fabricating a normally-on-type vertical power MOSFET, ions are implanted at an obtuse angle to a wall region (channel region) exposed from a trench after the trench is formed in a process of fabricating a normally-off-type vertical power MOSFET, thereby achieving depletion.

However, at this time, ion-implanted particles are scattered in a multiple manner on the inner surface of the trench, and an unnecessary diffusion layer is formed on a portion of the substrate corresponding to the bottom of the trench. As a result, for example, a leakage current may flow, and characteristics are degraded.

As has been described above, in the prior art, it is difficult to fabricate a normally-on-type vertical power MOSFET.

SUMMARY OF THE INVENTION

The object of the present invention is to provide a semiconductor device having a highly reliable normally-on-type vertical power MOSFET with stable characteristics, and a process of fabricating the semiconductor device at low cost and with a high yield.

According to an aspect of the present invention, there is provided a vertical MOSFET comprising:

a semiconductor substrate of a first conductivity type;

a first semiconductor layer of the first conductivity type provided on a major surface of the semiconductor substrate and functioning as a drain region;

a second semiconductor layer of a second conductivity type provided on a surface region of the first semiconductor layer and functioning as a channel region;

a third semiconductor layer of the first conductivity type provided on a surface region of the second semiconductor layer and functioning as a source region;

at least one trench extending from the surface of the third semiconductor layer and penetrating the second semiconductor layer such that a bottom portion of the trench reaches the first semiconductor layer;

a first insulating film formed on at least the bottom of the trench:

an ion implantation mask layer formed on the first insulating film and buried up to an intermediate portion of the trench;

a second insulating film formed on the ion implantation mask layer and on an inner wall of the trench and functioning as a gate insulating film; and a conductor layer provided to fill the trench on the second insulating film and functioning as a gate lead-out electrode.

According to another aspect of the invention, there is provided a process of fabricating a vertical MOSFET comprising the steps of:

forming a first semiconductor layer of a first conductivity type on a major surface of a semiconductor substrate of the first conductivity type, the first semiconductor layer functioning as a drain region;

introducing impurities of a second conductivity type into a selected surface region of the first semiconductor layer, thereby forming a second semiconductor layer of the second conductivity type functioning as a channel region;

introducing impurities of the first conductivity type into a selected surface region of the second semiconductor layer, thereby forming a third semiconductor layer of the first conductivity type functioning as a source region;

forming at least one trench extending, from the surface of the third semiconductor layer and penetrating the second semiconductor layer such that a bottom portion of the trench reaches the firs semiconductor layer;

forming a first insulating film on at least the bottom portion of the trench;

burying an ion implantation mask layer on the first insulating film up to an intermediate portion of the trench;

removing that portion the first insulating film, which is exposed to the trench; implanting channel ions into an exposed inner wall of the trench in a slanting direction;

forming a second insulating film on the ion implantation mask layer and on the inner wall of the trench, the second insulating film functioning as a gate insulating film;

depositing a conductor layer entirely on the second insulating film such that the trench is filled; and removing the conductor layer such that the conductor layer is left at least in the trench, thereby forming a gate lead-out electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3A s a cross-sectional view illustrating a first step of a process of fabricating the MOSFET shown in FIGS. 1 and 2;

FIG. 3B is a cross-sectional view illustrating a step subsequent that illustrated in FIG. 3A;

FIG. 3C is a cross-sectional view illustrating a step subsequent to that illustrated in FIG. 3B;

FIG. 3D is a cross-sectional view illustrating a step subsequent to that illustrated in FIG. 3C;

FIG. 3E is a cross-sectional view illustrating a step subsequent to that illustrated in FIG. 3D;

FIG. 3F is a cross-sectional view illustrating a step subsequent to that illustrated in FIG.

DETAILED DESCRIPTION OF THE PREFERRED EMBODIMENT

An embodiment of the present invention will now be described with reference to the accompanying drawings.

Figure 1:
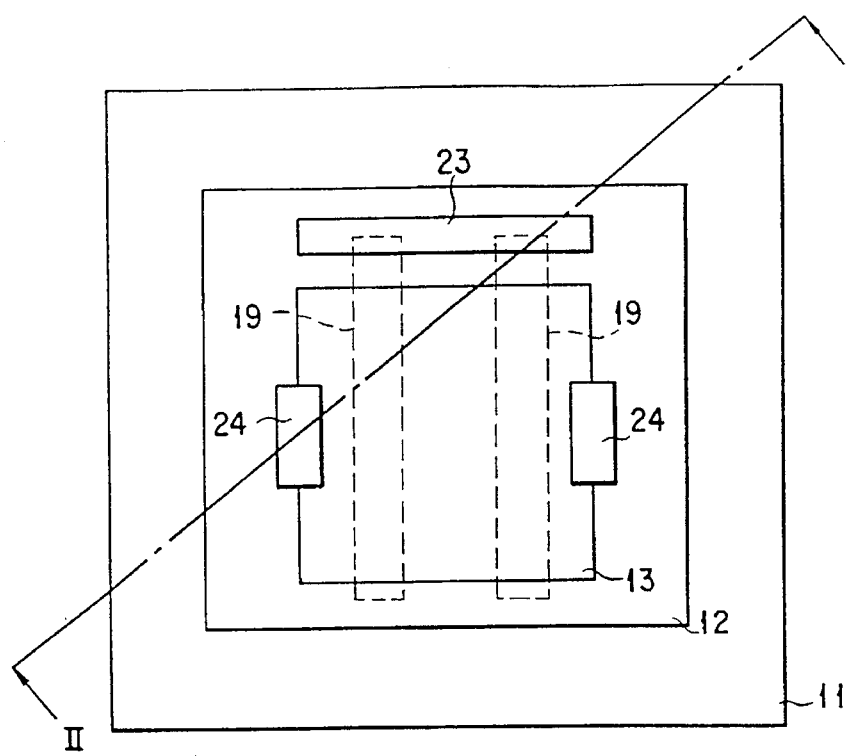
FIG. 1 is a plan view of an N-channel vertical power MOSFET according to an embodiment of the present invention.
Figure 2:
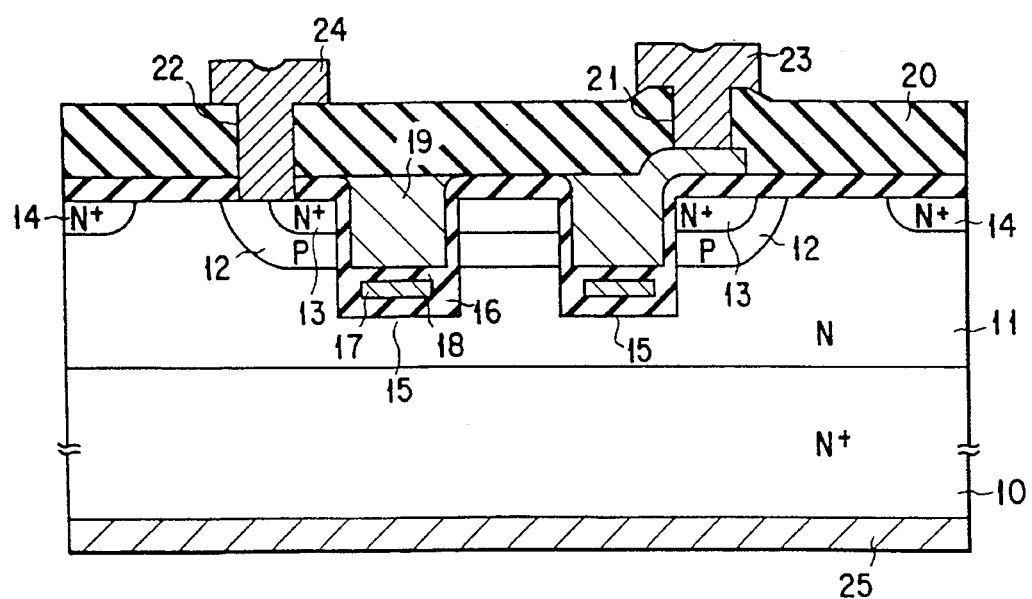
FIG. 2 is a cross-sectional view of the N-channel vertical power MOSFET shown in FIG. 1.

FIG. 1 shows a plan-view pattern of a part of a normally-on-type N-channel vertical power MOSFET according to an embodiment of the invention, which is formed on a discrete semiconductor device or a MOS integrated circuit. FIG. 2 is a cross-sectional view taken along line II—II in FIG. 2.

In FIGS. 1 and 2, an N-type first semiconductor layer (epitaxial layer) 11 functioning as a drain region and having a low impurity concentration is provided on a major surface of an $N^+$-type semiconductor substrate 10. A second semiconductor layer 12 of a second conductivity type (P-type in the present embodiment), which is formed by diffusion of P-type impurities and functions as a channel region, is provided on a surface region of the first semiconductor layer 11. Moreover, an $N^+$-type third semiconductor layer 13, which is formed by diffusion of $N^+$-type impurities and functions, as a source region, is provided on a surface region of the second semiconductor layer 12. The second semiconductor layer 12 and third semiconductor layer 13 are formed by double diffusion. Simultaneously with the formation of the third semiconductor layer 13, a fourth semiconductor layer 14, which is called "EQPR" and functions as a channel stopper region, is formed on a peripheral surface region of the first semiconductor layer 11. A plurality of (two in this embodiment) parallel trenches 15, each having a substantially U-shaped cross section and extending from a surface of the third semiconductor layer 13 through the second semiconductor layer 12 to the first semiconductor layer 11, are formed. A first insulating film 16 is provided on the bottom portion of the trench 15 and the surface of the third semiconductor layer 13. A polysilicon layer 17 is buried on the first insulating film 16 up to an middle portion of the trench 15. As will be described later, the polysilicon layer 17 functions as an ion implantation mask layer for preventing ions from being implanted in the trench bottom at the time of channel ion implantation. A second insulating film 18 functioning as a gate insulating film is formed on the polysilicon layer 17 and on the inner wall of the trench. Further, a gate lead-out electrode polysilicon layer 19 doped with impurities, e.g. phosphorus. A part of the polysilicon layer 19 is extended from the position of the trench 15 to reach the first insulating film 16 on the 'surface of the first semiconductor layer 11 beyond the third semiconductor layer 13.

A third insulating layer 20 is provided to cover the gate lead-out electrode polysilicon layer 19 and the first insulating film 16 on the surface of the substrate. Contact holes 21 and 22 are formed in the third insulating film 20. A gate electrode 23 is formed in electrical contact with that portion of the polysilicon layer 19, which is extended over the first insulating film 16 on the surface of the substrate on one side in the longitudinal of the trench 15. Similarly, a source electrode 24 is formed in common contact with the surfaces of the third semiconductor layer 13 and second semiconductor layer 12 via the other contact hole 22. By the source electrode 24, the substrate region and the source are short-circuited, and the influence of an NPN transistor parasitic to the substrate region and source is reduced. A drain electrode 25 is formed in contact with the bottom surface of the semiconductor substrate 10.

When a great number of vertical MOSFET cells are formed on the substrate 10, the drain electrode 25 is formed integral to each cell, the gate electrode 23 and source electrode 25 are connected commonly to each cell, and the cells are electrically connected in parallel.

In the N-channel vertical power MOSFET having the above structure, the side face of the second semiconductor layer 12 opposed to the gate lead-out electrode polysilicon layer 19 is depleted by ion implantation, and a normally-on-type operation is performed.

Specifically, the source electrode 24 is grounded, a positive voltage is applied to the drain electrode 25, and a ground potential is applied to the gate electrode 23. In this state, electrons flow from the third semiconductor layer 13 functioning as source region to the region in the second semiconductor layer 12 depleted by ion implantation and to the first semiconductor layer 11.

According to the structure of the above embodiment, the polysilicon layer 17 buried up to the intermediate portion of the trench 15 functions as an ion implantation mask layer for preventing ions from entering the trench bottom at the time of channel ion implantation, it is thus possible to avoid such an undesirable situation from arising, wherein ion-implanted particles are scattered by the trench inside face in a multiple manner and an unnecessary diffusion layer is formed on the trench bottom. Therefore, a highly reliable normally-on-type vertical power MOSFET with stable characteristics can be obtained.

A process of fabricating the N-channel vertical power MOSFET having the above structure will now be described with reference to FIGS. 3A to 3I.

As is shown in FIG. 3A, an N-type first semiconductor layer 11 about 10 μm thick is formed by an epitaxial growth method on a major surface of a semiconductor substrate 10 made of an N⁺-type single crystal silicon having a thickness of 150 μm.

Then, as is shown in FIG. 3B, P-type and N-type impurities are doubly diffused in a surface region of the first semiconductor layer 11, thereby forming a P-type second semiconductor layer 12 about 2.5 μm thick as well as a N⁺-type third semiconductor layer 13 having a thickness of 0.5 μm in a surface region of the second semiconductor layer 12. Simultaneously with the formation of the second semiconductor layer 12, a fourth semiconductor layer 14 is formed in a peripheral surface region of the first semiconductor layer 11.

Subsequently, as is shown in FIG. 3C, a CVD oxide film 26 is deposited on the entire surface of the first semiconductor layer 11. On the CVD oxide film 26, an etching mask 27 is formed by a PEP technique.

As is shown in FIG. 3D, trenches 15 are formed by reactive ion etching (RIE) using the mask 27. The trenches 15 are juxtaposed and penetrate the CVD oxide film 26, third semiconductor layer 13 and second semiconductor layer 12 such that the bottoms of the trenches 15 reach the first semiconductor layer 11.

The CVD oxide film 26 used for the etching is removed and then as shown in FIG. 3E, a first insulating film (SiO₂ film) 16 is formed to cover the inner wall of each trench 15. Subsequently, a phosphorus-doped polysilicon layer 17 is deposited enough to fill the trenches 15.

Then, as shown in FIG. 3B, the polysilicon layer 17 is etched back by chemical dry etching (CDE) to a level of an intermediate portion of each trench 15, i.e. a level lower than the second semiconductor layer 12. Thereafter, the first insulating film 16 exposed from the inner wall of each trench 15 is removed by buffered hydrofluoric acid (BFH). While the substrate is being rotated, phosphorus ions or arsenic ions are ion-implanted in the side face of each trench by ion implantation at an obtuse angle to the surface of the substrate (the angle of implantation is, e.g. 5° to 45°). Thereby, a surface region of the second semiconductor layer 12 exposed from the side face of each trench is depleted. In this case, since the polysilicon layer 17 is buried up to the intermediate portion of each trench 15, as mentioned above, there is no concern that an unnecessary diffusion layer is formed on the bottom of each trench by multiple scattering of ion-implanted particles.

Figure 3G:
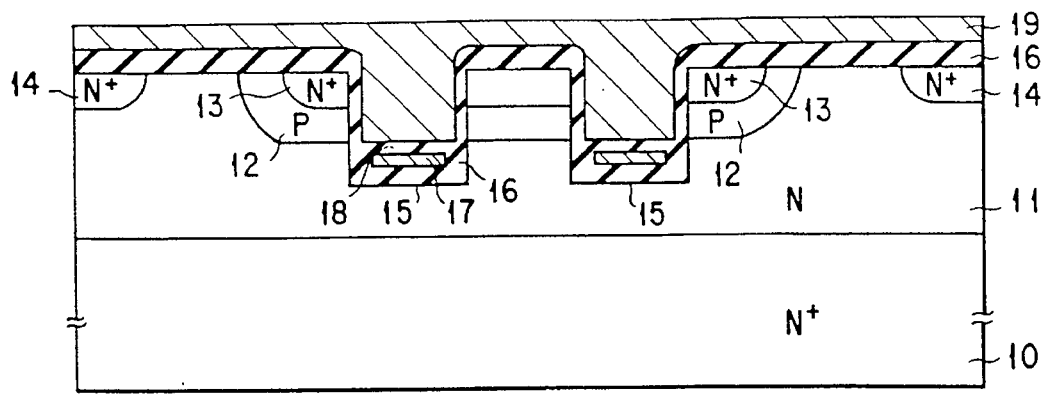
FIG. 3G is a cross-sectional view illustrating a step subsequent to that illustrated in FIG. 3F.

In FIG. 3G, a second insulating film 18 functioning as gate insulating film is formed by thermal oxidation on the surface of the polysilicon layer 17 within each trench 15 and on the surfaces of the second and third semiconductor layers 12 and 13 exposed from each trench 15. Subsequently, a phosphorus-doped polysilicon layer 19 is deposited enough to bury the trenches 15. In this case, phosphorus may be doped in the polysilicon layer 19 after the polysilicon layer 19 has been deposited.

Figure 3H:
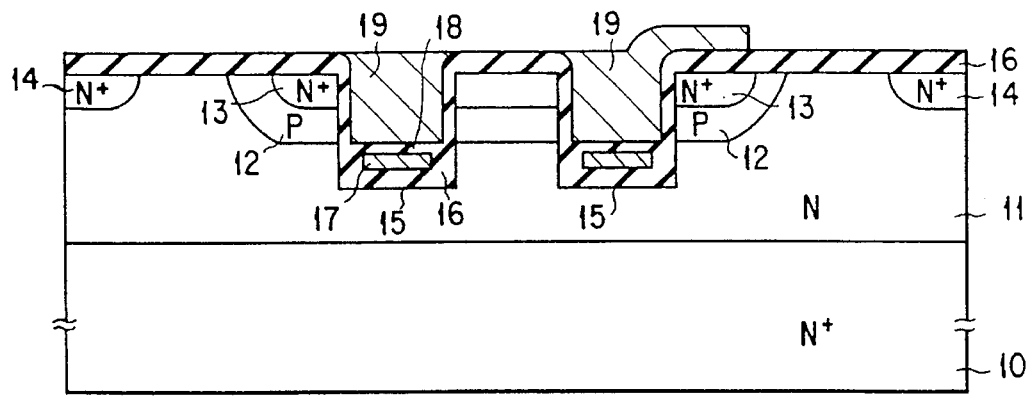
FIG. 3H is a cross-sectional view illustrating a step subsequent to that illustrated in FIG. 3G.

Using the PEP technique and RIE technique, the gate lead-out electrode polysilicon layer 19 is patterned so that, as shown in FIG. 3H, a part of the polysilicon layer 19 departs from one of the trenches 15 and extends over that portion of the first insulating film 16 located on the third semiconductor layer 13.

Figure 3I:
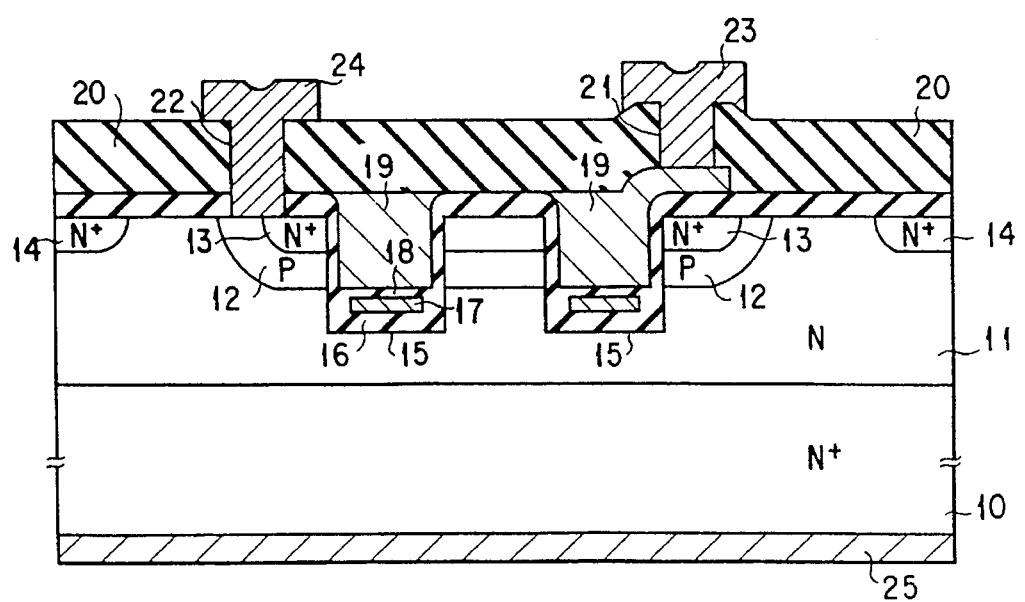
FIG 3I is a cross-sectional view illustrating a step subsequent to that illustrated in FIG. 3H.

Thereafter, as shown in FIG. 3I, a third insulating film 20 of phospho-silicate glass (PSG) 600 nm thick is deposited on the entire surface of the resultant structure by means of CVD. Contact holes 21 and 22 are formed at a location of a part of the third insulating layer 20, i.e. a location corresponding to the polysilicon layer 19 on the third semiconductor layer 13, and a location near the boundary of the second and third semiconductor layers 12 and 13.

Then, aluminum (Al) or an aluminum silicon alloy (Al·Si) is deposited on the entire surface of the resultant structure to a thickness of 2 μm, thus effecting a patterning step. Thereby, a gate electrode 23, which is put in electrical contact with the gate lead-out electrode polysilicon layer 19 via the contact hole 21 is formed. In addition, a source electrode 24 is formed in electrical contact commonly with the surfaces of the second and third semiconductor layers 12 and 13. On the other hand, a drain electrode 25 is formed on the bottom side of the wafer, i.e. semiconductor substrate 10, thereby obtaining a vertical MOSFET.

According to the process of fabricating the vertical power MOSFET of the present embodiment, the trenches 15 are formed after the double diffusion. After the insulating film 18 is formed on the inner walls of the trenches 15, the polysilicon layer 17 functioning as ion implantation mask layer is buried up to the intermediate portion of each trench. In this state, channel ions are implanted in the trench side regions, thereby depleting the channel regions. Thereafter, the gate lead-out electrode polysilicon layer 19 is buried in the trenches.

As compared to the conventional method in which channel ions are implanted in the surface of the substrate after the double diffusion in order to deplete the planar-structure Dower MOSFET, the number of steps of the photo engraving process (PEP) is not increased and no misalignment occurs between the polysilicon gate electrode and the channel region. Accordingly, the manufacturing cost can be reduced and the yield can be increased.

As has been described above, according to the present invention, there is provided a semiconductor device having a highly reliable normally-on-type vertical power MOSFET with stable characteristics, and a process of fabricating the semiconductor device at low cost and with a high yield.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A process of fabricating a vertical MOSFET comprising the steps of:

forming a first semiconductor layer of a first conductivity type on a major surface of a semiconductor substrate of the first conductivity type, said first semiconductor layer functioning as a drain region;

selectively introducing impurities of a second conductivity type into a surface region of the first semiconductor layer, thereby forming a second semiconductor layer of the second conductivity type functioning as a channel region;

selectively introducing impurities of the first conductivity type into a surface region of the second semiconductor layer, thereby forming a third semiconductor layer of the first conductivity type functioning as a source region;

forming at least one trench extending from the surface of the third semiconductor layer and penetrating the second semiconductor layer such that a bottom portion of said trench reaches the first semiconductor layer;

forming a first insulating film on at least the bottom portion of the trench;

depositing an ion implantation mask layer on said first insulating film such that said trench is filled, and etching back said ion implantation mask layer so that said ion implantation mask layer remains up to an intermediate portion of said trench;

removing that portion of the first insulating film, which is exposed to the trench;

implanting channel ions into an exposed inner wall of the trench in a slanting direction;

forming a second insulating film on said ion implantation mask layer and on the exposed inner wall of said trench, said second insulating film functioning as a gate insulating film;

depositing a conductor layer entirely on the second insulating film such that said trench is filled; and removing said conductor layer such that said conductor layer is left at least in said trench, thereby forming a gate lead-out electrode.

2. The process according to claim 1, wherein said step of forming said first semiconductor layer is carried out by an epitaxial growth method.

3. The process according to claim 1, wherein said step of burying the ion implantation mask layer on the first insulating film up to the intermediate portion of said trench comprises the sub-steps of:

a first sub-step of depositing said ion implantation mask layer over the entire surface; and a second sub-step of etching back said ion implantation mask layer.

4. The process according to claim 1, wherein said step of implanting channel ions into the exposed inner wall of the trench in the slanting direction is carried out while said semiconductor substrate is being rotated.

5. The process according to claim 1, further comprising the steps of:

forming a third insulating film covering continuously said gate lead-out electrode, the surface of said first semiconductor layer, the surface of said second semiconductor layer and the surface of said third semiconductor layer;

forming first and second contact holes in said third insulating film;

depositing a metallic layer over the resultant structure and patterning said metallic layer, thereby forming a gate electrode put in contact with said gate lead-out electrode via the first contact hole and a source electrode put in contact with the surface of said second semiconductor layer and the surface of said third semiconductor layer via said second contact hole; and forming a drain electrode on a bottom surface of said semiconductor substrate.

6. A process of fabricating a semiconductor device, comprising the steps of:

selectively introducing impurities of a second conductivity type into a surface region of a first semiconductor layer of a first conductivity type, thereby forming a second semiconductor layer of the second conductivity type;

forming at least one trench extending from the surface of the second semiconductor layer and penetrating said second semiconductor layer such that a bottom portion of said trench reaches the first semiconductor layer;

forming a first insulating layer on at least the bottom portion of said trench;

depositing an ion implantation mask layer on said first insulating film such that said trench is filled, and etching back said ion implantation mask layer so that said ion implantation mask layer remains up to an intermediate portion of said trench;

removing a portion the first insulating film, which is exposed to the trench; and implanting channel ions into an exposed inner wall of the trench in a slanting direction.

7. The process according to claim 6, wherein said step of burying the ion implantation mask layer on the first insulating film up to the intermediate portion of said trench comprises the sub-steps of:

a first sub-step of depositing an ion implantation mask layer over the entire surface; and a second sub-step of etching back said ion implantation mask layer.

8. The process according to claim 6, wherein a said step of implanting channel ions into the exposed inner wall of the trench in the slanting direction is carried out while substrate on which said first semiconductor layer is formed.

9. The process according to claim 6, further comprising the steps of:

forming a second insulating film on said ion implantation mask layer and inner wall of the exposed trench;

deposition a conductor layer entirely on the second insulating film such that said trench is filled; and removing said conductor layer such that said conductor layer is left at least in said trench, thereby forming an electrode.

* * * * *